(12) United States Patent
Deng et al.

(10) Patent No.: US 11,705,437 B1
(45) Date of Patent: Jul. 18, 2023

(54) INTERCONNECTION STRUCTURE OF SYSTEM ON WAFER AND PCB BASE ON TSV PROCESS AND METHOD FOR MANUFACTURING THE SAME

(71) Applicant: ZHEJIANG LAB, Zhejiang (CN)

(72) Inventors: Qingwen Deng, Hangzhou (CN); Kun Zhang, Hangzhou (CN); Shunbin Li, Hangzhou (CN); Ruyun Zhang, Hangzhou (CN)

(73) Assignee: ZHEJIANG LAB, Hangzhou (CN)

( * ) Notice: Subject to any disclaimer, the term of this patent is extended or adjusted under 35 U.S.C. 154(b) by 0 days.

(21) Appl. No.: 18/098,726

(22) Filed: Jan. 19, 2023

(51) Int. Cl.
*H01L 25/065* (2023.01)
*H01L 21/67* (2006.01)
*H01L 23/48* (2006.01)

(52) U.S. Cl.
CPC .... *H01L 25/0657* (2013.01); *H01L 21/67103* (2013.01); *H01L 23/481* (2013.01)

(58) Field of Classification Search
CPC ........... H01L 25/0657; H01L 21/67103; H01L 23/481
See application file for complete search history.

(56) References Cited

U.S. PATENT DOCUMENTS

| | | | | |
|---|---|---|---|---|
| 2015/0145116 A1* | 5/2015 | Uzoh | ...................... | H01L 24/73 257/777 |
| 2016/0293557 A1 | 10/2016 | Topak et al. | | |
| 2017/0040191 A1* | 2/2017 | Benjaminson | .... | H01J 37/32082 |
| 2018/0158798 A1* | 6/2018 | Lin | ........................ | H01L 21/568 |
| 2019/0304959 A1* | 10/2019 | Yu | ........................ | H01L 21/4857 |
| 2021/0098335 A1 | 4/2021 | Yu et al. | | |
| 2021/0358726 A1* | 11/2021 | Ko | ........................ | H01J 37/32642 |
| 2022/0052023 A1* | 2/2022 | Fu | ........................ | H01L 23/5384 |
| 2022/0230931 A1* | 7/2022 | Wang | ..................... | H01L 23/147 |

FOREIGN PATENT DOCUMENTS

| | | |
|---|---|---|
| CN | 112736063 A | 4/2021 |
| CN | 213755121 U | 7/2021 |
| CN | 114650655 A  * | 6/2022 |
| CN | 114650655 A | 6/2022 |
| TW | M329914 U | 4/2008 |
| WO | WO-2022189128 A1  * | 9/2022 |

OTHER PUBLICATIONS

CN First Office Action(202210664279.8); dated Jul. 28, 2022.

* cited by examiner

*Primary Examiner* — Mamadou L Diallo
(74) *Attorney, Agent, or Firm* — W&G Law Group

(57) ABSTRACT

An interconnection structure of a system on wafer and a PCB based on a TSV process and a method for manufacturing the same. The structure comprises a bottom structural part and a top structural part, the upper surface of the bottom structural part is provided with a plurality of positioning holes; the lower surface of the top structural part is provided with positioning pins; the upper surface of the bottom structural part is provided with a bottom groove, and a system on wafer is arranged in the bottom groove; the lower surface of the system on wafer is connected with the bottom groove; the lower surface of the top structural part is provided with a top groove, and a PCB preformed die is connected in the top groove, and the other end of the PCB preformed die is connected with the system on wafer by an elastic connector.

9 Claims, 7 Drawing Sheets

INTERCONNECTION STRUCTURE OF SYSTEM ON WAFER AND PCB BASE ON TSV PROCESS AND METHOD FOR MANUFACTURING THE SAME

CROSS-REFERENCE TO RELATED APPLICATIONS

The present application claims priority to Chinese Patent Application No. 202210664279.8, filed on Jun. 14, 2022, the content of which is incorporated herein by reference in its entirety.

TECHNICAL FIELD

The present disclosure relates to that technical fields of micro-nano process technology, liquid-cooled runner technology, through-silicon via (TSV) technology, printed circuit board manufacturing technology, mechanical process technology, high-power heat dissipation and the like, in particular to an interconnection structure of a system on wafer and a PCB based on TSV process and a method for manufacturing the same.

BACKGROUND

In the field of semiconductor manufacturing, there is a famous Moore's Law. However, in recent years, the line width of micro-nano processing has reached 3 nm or even smaller, Moore's Law has gradually failed, and the improvement of computing performance by technological progress has obviously slowed down, while the data volume of the Internet of Everything is exploding exponentially, therefore the "scissors gap" between data scale and computing power is widening. Integrated circuits are ushering in a significant technological and industrial transformation period in the "post-Moore era".

As Moore's Law has been an unsustainable problem, the academic and industrial circles mainly adopt System on Chip (SOC) technology, System In Package (SIP) technology and System on Wafer (SOW) technology to expand Moore's Law. Essentially, SOC technology is still a chip design technology, which integrates chips with different functions and the same technology. Due to the limitations of chip processing technology and the performance of semiconductor materials, it is difficult for SOC to form a powerful independent system. A high-density substrate is the physical carrier of SIP integration. Its functions include electrical interconnection between components, transmission of RF, analog, digital and other signals, and embedded integration of some passive components, power dividers, filters, etc. to provide heat dissipation channels for components. In essence, SIP packaging technology uses flip chip technology or wire bonding technology to package 2D by using a plurality of chips, and the packaged devices still need to be mounted on a PCB to work together with other devices (such as power management, interface driver, I/O interface devices). Moreover, due to the limitation of SIP's own integration scale and some functional integration means, it is still difficult to comprehensively solve the necessary requirements of the system such as heat dissipation, power supply, external interconnection and platform integration, and cannot form an independent system.

Different from SOC and SIP, SOW uses a whole semiconductor wafer, such as a 2- to 12-inch silicon wafer. The wafer is not diced, and the wafer is wired by a RDL process. A semiconductor process is adopted for the wafer to prepare active devices, such as switches, operational amplifiers, ADCs, logic unit circuits, etc. according to the system application requirements, it is also possible to use RDL wiring instead of the traditional substrate, and all functional circuits and active units are integrated on the wafer. SOW runs through the whole process of the IC design, processing and packaging, integrates advanced concepts such as preformed die assembly and wafer integration, and with the remarkable advantages of wafer-level interconnection such as high bandwidth, low latency and low power consumption, it can realize the integration of thousands of "preformed die" particles such as sensing, radio frequency, calculation, storage and communication on a single wafer. By breaking the boundary conditions such as design methods, implementation materials and integration methods of existing integrated circuits, the current chip performance limit is effectively cracked and the "ceiling effect" faced by key information infrastructure relying on "stacked" engineering technology routes is broken, the technical and physical form of traditional equipment or systems is refreshed, and the comprehensive technical indicators of the system gain multiplicative gains, which meets the sustainable development needs of new-generation infrastructure such as 5G, big data, cloud platform, AI, edge computing and intelligent network in the intelligent era.

However, constrained by the mechanical strength of the wafer and the RDL wiring rules, the difficulty of realizing a large-size SOW has encountered unprecedented challenges. The main reason is that although the chiplet functional modules such as computing power, storage, control and interface IP can be integrated on the wafer, the peripheral circuits such as power management module, I/O connector, transducer sensor, display module and mechanical transmission module still need to be integrated on the traditional PCB. This is because the mechanical strength and wiring layers of the PCB are much better than those of the wafer. Therefore, in order to realize the stable, reliable and efficient operation of SOW, it is a good solution to integrate SOW and PCB by combining the respective advantages of the wafer circuit and PCB circuit. However, the wiring of PCB leads to inconsistent copper residual rate in the inner layer, asymmetric via holes on the front and back sides, inconsistent laminated materials and thicknesses of various layers, and different thermal expansion coefficients (CTEs) of laminated daughter boards.

Therefore, an interconnection structure of a SOC and a PCB based on a TSV process and a manufacturing method thereof have been proposed to solve the above technical problems.

SUMMARY

The purpose of the present disclosure is to provide an interconnection structure of a system on wafer and a PCB based on a TSV process and a manufacturing method thereof. A rigid structural part groove is used to fix and flatten the warped PCB, a viscous glue and structural part groove are used to fix the system on wafer, chiplets and wafer pressure welding pads are connected through TSV holes, and an elastic connector is used to connect the PCB pad and wafer pressure welding pads, thus solving the problem of information interaction between large-sized wafers and warped PCBs, and solving the problem of heat dissipation of the system on wafer by using a structural part liquid cooling channel.

The technical solution adopted by the present disclosure is as follows:

An interconnection structure of a system on wafer and a PCB based on a TSV process, includes a bottom structural part and a top structural part. In an embodiment, that bottom structural part is detachably linked with the top structural part via a connector; the upper surface of the bottom structural part is provided with a plurality of positioning holes; the lower surface of the top structural part is provided with positioning pins which are matched with the positioning holes; the upper surface of the bottom structural part is provided with a bottom groove, and a system on wafer is arranged in the bottom groove; the lower surface of the system on wafer is connected with the bottom groove by a viscous glue; the lower surface of the top structural part is provided with a top groove, and a PCB preformed die is connected in the top groove by a connector, and the other end of the PCB preformed die is connected with the system on wafer by an elastic connector.

Further, the system on wafer includes a wafer, chiplets, an organic filler, wafer pressure welding pads, wafer bonding pads and chiplet bonding pads; the wafer is provided with a plurality of groups of through TSV holes; a lower surface of the wafer corresponding to the TSV holes is provided with the wafer bonding pads; a lower surface of the wafer bonding pad is connected with the chiplet bonding pad, and the other end of the chiplet bonding pad is connected with the chiplet; an organic filler is filled between adjacent chiplets, and the wafer pressure welding pads are arranged on an upper surface of the wafer corresponding to the TSV holes.

Further, the lower surface of the wafer bonding pad is bonded to the chiplet bonding pad by a thermo-compressed bonding process or a pollution-free welding process.

Further, there are four TSV holes in each group, and the TSV holes and the wafer bonding pads are arranged in a staggered manner.

Further, the PCB preformed die includes a PCB and a bonding pad, an upper surface of the top groove is provided with a plurality of bosses, and the PCB is provided with through holes corresponding to the bosses; the PCB penetrates through the through holes by a connector and extends to the bosses to be connected with the top groove; a plurality of blind holes corresponding to the wafer pressure welding pads are uniformly arranged on a lower surface of the PCB; a top wall of the blind hole is provided with the bonding pad, a lower surface of the bonding pad is connected with the elastic connector, and the other end of the elastic connector is connected with the wafer pressure welding pad.

Further, a liquid cooling channel is arranged inside the bottom structural part.

Further, both ends of the liquid cooling channel are provided with connectors.

Further, the bottom structural part and the top structural part are made of metal or ceramic.

Further, the elastic connector is a micro-spring, a wool button or an elastic insulator.

The present disclosure further provides a method for manufacturing an interconnection structure of a system on wafer and a PCB based on a TSV process, including the following steps:

S1, machining a plurality of through holes on a PCB, machining a plurality of blind holes on a lower surface of the PCB, and welding bonding pads in the blind holes to form a PCB preformed die;

S2, preparing a plurality of through TSV holes on a wafer by a micro-nano process. In an embodiment, wafer pressure welding pads are arranged on an upper surface of the wafer corresponding to the TSV holes, and wafer bonding pads are arranged on a lower surface of the wafer corresponding to the TSV holes; buckling a plurality of chiplets on the wafer upside down, so that chiplet bonding pads are aligned with the wafer bonding pads, and are bonded together by a hot-press bonding process or a pollution-free welding process, then filling gaps with an organic filler, and then polishing and thinning by a CMP process to form a system on wafer;

S3, machining a top structural part, preparing a top groove on a lower surface of the top structural part, preparing a boss in the top groove, and providing a positioning pin on the lower surface of the top structural part;

S4, machining a bottom structural part, preparing a bottom groove on an upper surface of the bottom structural part, further preparing a positioning hole matched with the top structural part in the bottom structural part, and preparing a closed liquid cooling channel inside the bottom structural part;

S5, placing the PCB preformed die in the top groove of the top structural part, and using a connector to pass through the through hole of the PCB and extending to the boss to be fixedly connected with the top groove to form a top preformed die;

S6, placing the system on wafer in the bottom groove of the bottom structural part with the chiplets facing downwards, and fittedly fixing the system on wafer and the bottom groove to form a bottom preformed die;

S7, inserting an elastic connector into the blind hole of the PCB, connecting the elastic connector with the bonding pad and matching the positioning pin of the top structural part with the positioning hole of the bottom structural part, so that the other end of the elastic connector is connected with the wafer pressure welding pads at the system on wafer, and penetrating through the top structural part by a plurality of connectors and extending to the bottom structural part to form an interconnected structure; and S8, installing a joint at a port of the liquid cooling channel of the bottom structural part, and sealing with a glue to ensure no water leakage, thus completing assembly.

The present disclosure has the beneficial effects that: by using the top groove and boss of the top structural part, not only can the PCB be supported and fixed, but also the warping problem caused by the CTE difference of PCB factor boards and the inconsistency and asymmetry of high-temperature lamination, inner layer wiring, blind holes, copper thickness and the like can be corrected and improved, and the warping curvature of the PCB can be reduced by at least 90%. As the most advanced micro-nano processing technology, the TSV process is widely used because of its high connection density and small signal delay. However, the existing TSV process is only mature in multi-layer stacked packaging of small-area chips (<30 mm×30 mm), such as 128-layer, 164-layer and 196-layer memory chips. There is no mature application solution for high-density TSV hole technology of large-size wafers (>8 inches). According to the present disclosure, the debug port, the feed port and the signal I/O port of the system on wafer are uniformly distributed to the same side of the wafer creatively through the TSV process of the high-density large-size wafer, so as to exchange information with peripheral circuits such as PCBs, which solves the problems of high-density and high-speed signal connection and transmission on the wafer, and also significantly reduces the difficulty and complexity of wiring on the wafer (RDL). Manufacturing high-density TSV holes on large-sized wafers requires wafer thinning, and metallization filling of TSV holes will also cause wafer warpage, which is the main reason why traditional high-density TSV process is only used for 3D packaging of small-sized chips. According to the present disclosure, by utilizing the flexibility and extensibility of the viscous glue and combining the scalability of the elastic connector, a certain pressure is uniformly applied to the wafer through the PCB preformed die, so that the wafer warpage is improved, and the good electrical connection between the wafer and the PCB is realized, thereby solving the problem of circuit information communication between the system on wafer and the PCB.

DESCRIPTION OF REFERENCE SIGNS

1—Bottom structural part, 11—Positioning hole, 12—Bottom groove, 13—Liquid cooling channel, 2—Top structural part, 21—Positioning pin, 22—Top groove, 221—Boss, 3—System on wafer, 31—Wafer, 311—TSV hole, 32—Chiplet, 33—Organic filler, 34—Wafer pressure welding pad, 35—Wafer bonding pad, 36—Chiplet bonding pad, 4—Viscous glue, 5—PCB preformed die, 51—PCB, 511—Through hole, 512—Blind hole, 52—Bonding pad, 6—Elastic connector, 7—Joint.

DESCRIPTION OF EMBODIMENTS

The following description of at least one exemplary embodiment is merely illustrative in nature, and is in no way intended to limit the present disclosure, its application or use. Based on the embodiment of the present disclosure, all other embodiments obtained by those skilled in the art without creative labor are within the scope of the present disclosure.

Figure 1:
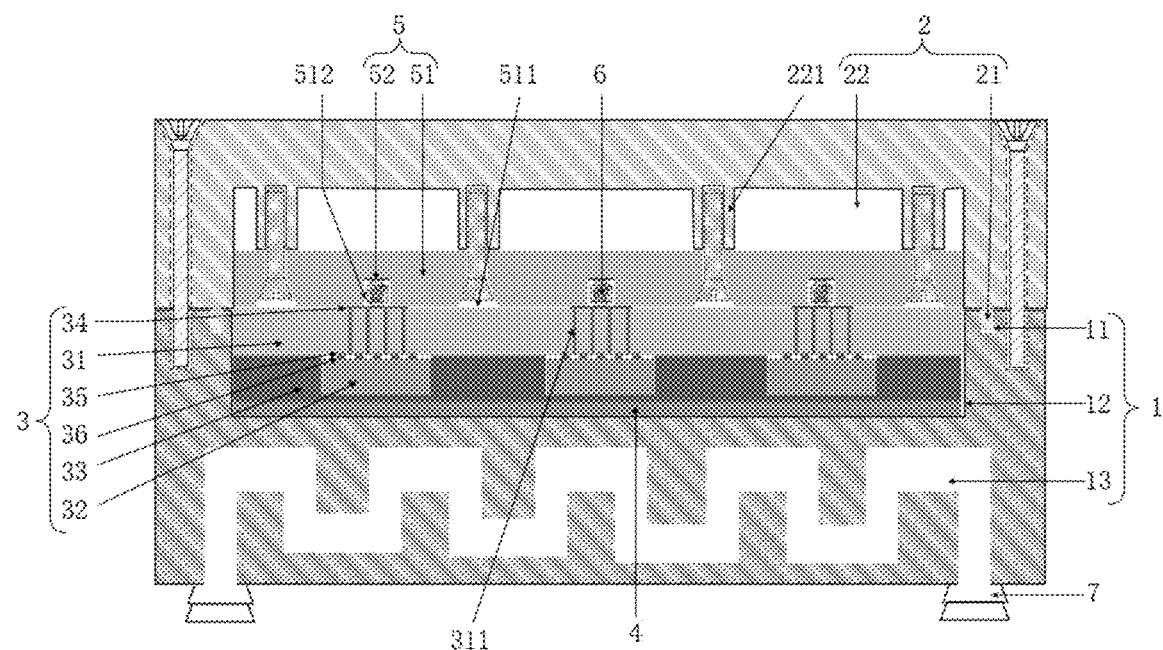
FIG. 1 is a schematic diagram of the overall structure of the present disclosure.

Refer to FIG. 1, an interconnection structure between a system on a chip and a PCB based on TSV process includes a bottom structural part 1 and a top structural part 2. In an embodiment, the bottom structural part 1 is detachably linked with the top structural part 2 by a connector; the upper surface of the bottom structural part 1 is provided with a plurality of positioning holes 11, and the lower surface of the top structural part 2 is provided with positioning pins 21 that are matched with the positioning holes 11; an upper surface of the bottom structural part 1 is provided with a bottom groove 12; an system on wafer 3 is provided in the bottom groove 12, and a lower surface of the system on wafer 3 is connected with the bottom groove 12 by a vicious glue 4; a lower surface of the top structural part 2 is provided with a top groove 22, and a PCB preformed die 5 is connected in the top groove 22 by a connector; the other end of the PCB preformed die 5 is connected to the system on wafer 3 by an elastic connector 6.

The system on wafer 3 includes a wafer 31, chiplets 32, an organic filler 33, wafer pressure welding pads 34, wafer bonding pads 35 and chiplet bonding pads 36; the wafer 31 is provided with a plurality of groups of through TSV holes 311; a lower surface of the wafer 31 corresponding to the TSV holes 311 is provided with the wafer bonding pads 35; a lower surface of the wafer bonding pad 35 is connected with the chiplet bonding pad 36, and the other end of the chiplet bonding pad 36 is connected with the chiplet 32; the organic filler 33 is filled between adjacent chiplets 32, and the wafer pressure welding pads 34 are arranged on an upper surface of the wafer 31 corresponding to the TSV holes 311.

A liquid cooling channel 13 is arranged inside the bottom structural part 1.

Both ends of the liquid cooling channel 13 are provided with connectors 7.

The bottom structural part 1 and the top structural part 2 are made of metal or ceramic.

The elastic connector 6 is a micro-spring, a wool button or an elastic insulator.

A method for manufacturing an interconnection structure of a system on wafer and a PCB based on a TSV process, including the following steps:

S1, machining a plurality of through holes 511 on a PCB 51, machining a plurality of blind holes 512 on a lower surface of the PCB 51, and welding bonding pads 52 in the blind holes 512 to form a PCB preformed die 5;

S2, preparing a plurality of through TSV holes 311 on a wafer 31 by a micro-nano process. In an embodiment, wafer pressure welding pads 34 are arranged on an upper surface of the wafer 31 corresponding to the TSV holes 311, and wafer bonding pads 35 are arranged on a lower surface of the wafer 31 corresponding to the TSV holes 311; buckling a plurality of chiplets 32 on the wafer 31 upside down, so that chiplet bonding pads 36 are aligned with the wafer bonding pads 35, and are bonded together by a hot-press bonding process or a pollution-free welding process, then filling gaps with an organic filler 33, and then polishing and thinning by a CMP process to form a system on wafer 3;

S3, machining a top structural part 2, preparing a top groove 22 on a lower surface of the top structural part 2, preparing a boss 221 in the top groove 22, and providing a positioning pin 21 on the lower surface of the top structural part 2;

S4, machining a bottom structural part 1, preparing a bottom groove 12 on an upper surface of the bottom structural part 1, further preparing a positioning hole 11 matched with the top structural part 2 in the bottom structural part 1, and preparing a closed liquid cooling channel 13 inside the bottom structural part 1;

S5, placing the PCB preformed die 5 in the top groove 22 of the top structural part 2, and using a connector to pass through the through hole 511 of the PCB 51 and extending to the boss 221 to be fixedly connected with the top groove 22 to form a top preformed die;

S6, placing the system on wafer 3 in the bottom groove 12 of the bottom structural part 1 with the chiplets 32 facing downwards, and fittedly fixing the system on wafer 3 and the bottom groove 12 to form a bottom preformed die;

S7, inserting an elastic connector 6 into the blind hole 512 of the PCB 51 and connecting the elastic connector 6 with the bonding pad 52, and matching the positioning pin 21 of the top structural part 2 with the positioning hole 11 of the bottom structural part 1, so that the other end of the elastic connector 6 is connected with the wafer pressure welding pads 34 at the system on wafer 3, and penetrating through the top structural part 2 by a plurality of connectors and extending to the bottom structural part 1 to form an interconnected structure; and S8, installing a joint 7 at a port of the liquid cooling channel 13 of the bottom structural part 1, and sealing with a glue to ensure no water leakage, thus completing assembly.

EXAMPLES

Figure 2:
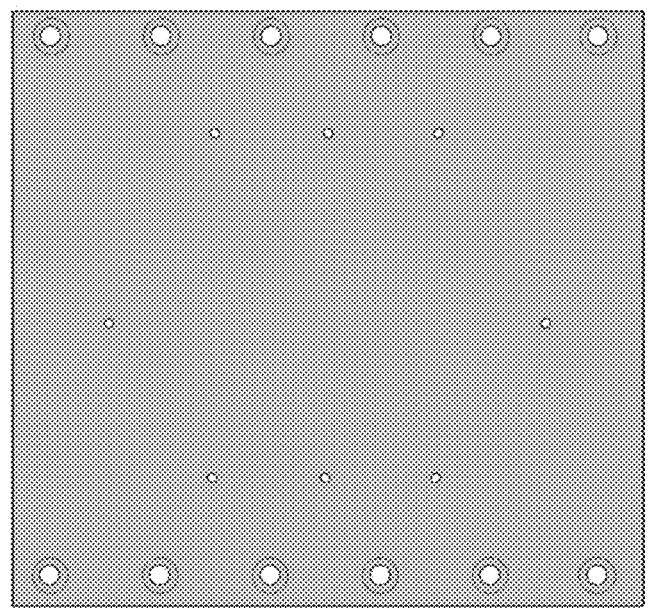
FIG. 2 is a top view and a side view of the daughter board according to an embodiment of the present disclosure.
Figure 3:
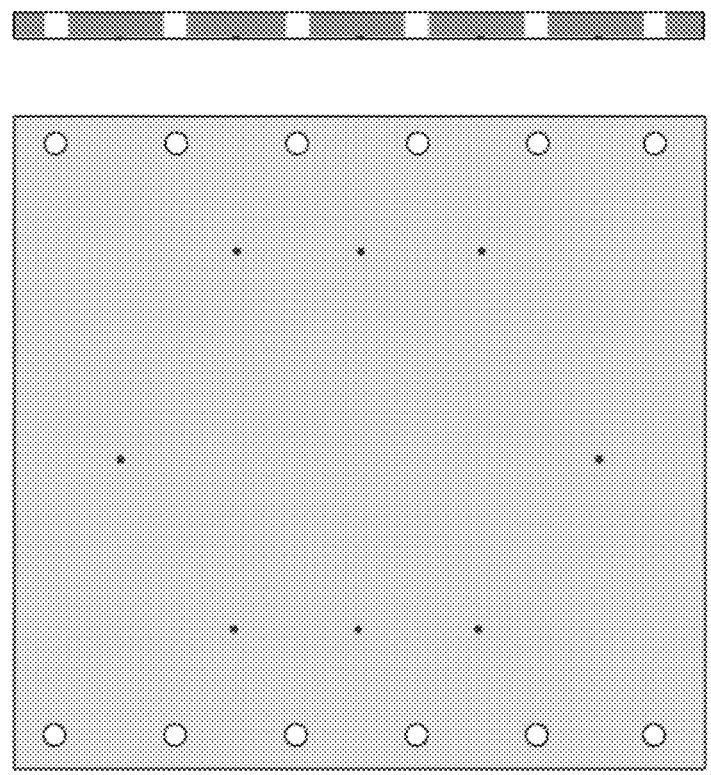
FIG. 3 is a bottom view and a side view of the daughter board according to an embodiment of the present disclosure.
Figure 4:
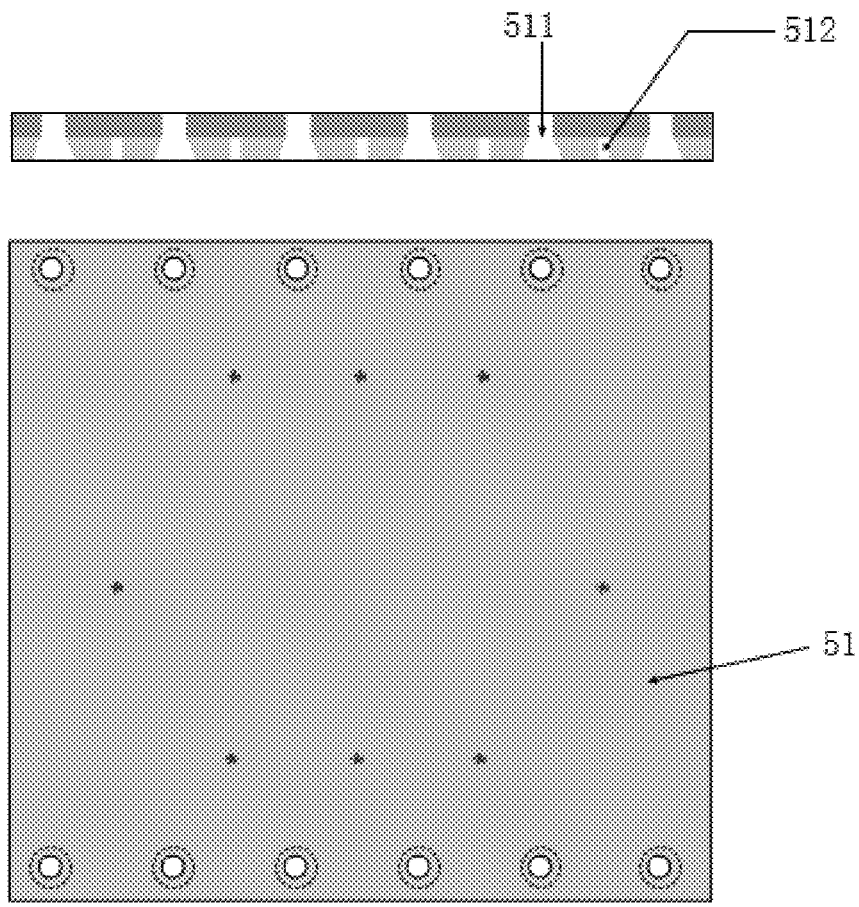
FIG. 4 is a bottom view and a side view of a PCB according to an embodiment of the present disclosure.

In S1, as shown in FIG. 2, multiple layers of PCB boards 51 with a size of 340 mm×340 mm×1.5 mm was laminated with a Panasonic M4 board, with 6 layers in total. A number of blind holes 512 were machined on the lower surface of the PCB 51, and the bonding pads 52 with a diameter of 0.3 mm were connected in the blind holes 512. The bonding pads 52 had electrical connection characteristics with PCB module units (such as a power management module, an I/O module, and a Debug module), and then multiple M2.5 countersunk through-holes were processed at the same side with the bonding pads 52. The above PCB board is denoted as a daughter board 1. As shown in FIG. 3, a high-strength and copper-free single-layer PCB daughter board was prepared with a size of 340 mm×340 mm×1.5 mm. The machining position, the quantity, the size and the M2.5 countersunk through-holes (i.e., φ0.3 mm through-hole) of the single-layer PCB daughter board were matched with those of daughter board 1, and the above single-layer PCB daughter board is denoted as daughter board 2. As shown in FIG. 4, daughter board 1 and daughter board 2 were laminated together, and a solder resist layer with a thickness of 10 μm was prepared by using a screen printing process to complete the processing of the PCB preformed die 5.

Figure 5:
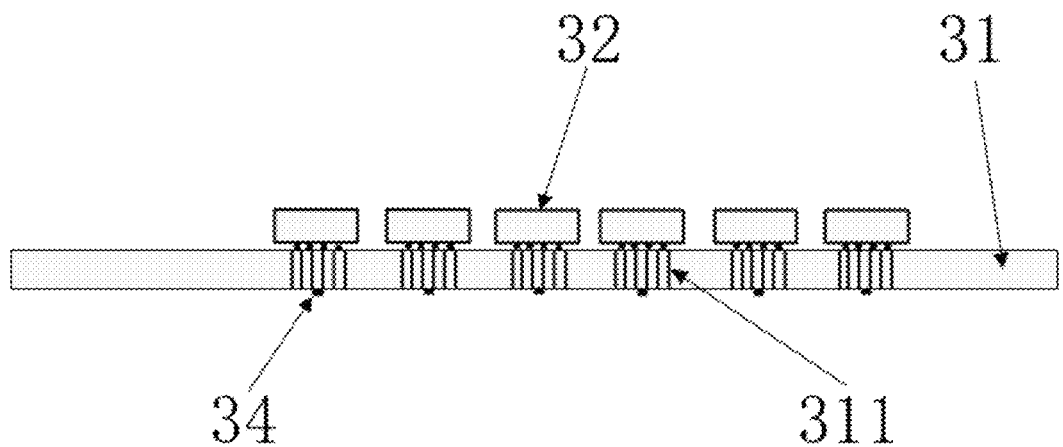
FIG. 5 is a side view of a system on wafer according to an embodiment of the present disclosure.
Figure 6:
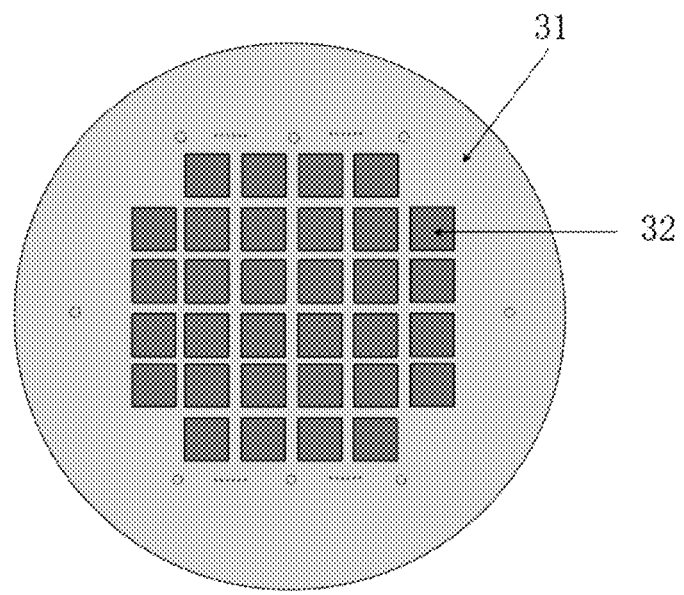
FIG. 6 is a top view of a system on wafer according to an embodiment of the present disclosure.
Figure 7:
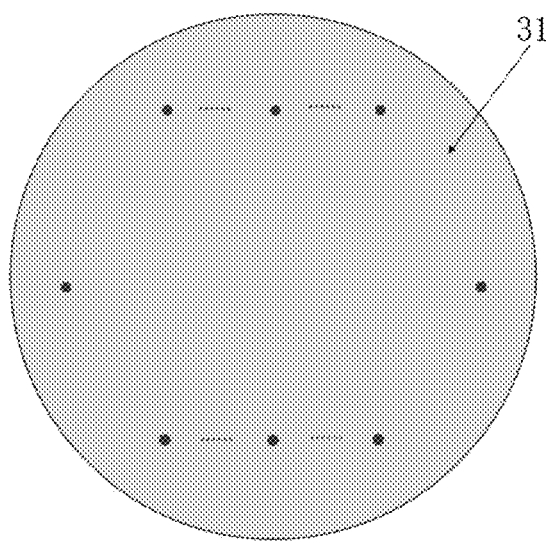
FIG. 7 is a bottom view of a system on wafer according to an embodiment of the present disclosure.

In S2, referring to FIG. 5-7, a plurality of wafer pressure welding pads 34 were machined on one side of a 12-inch silicon wafer 31 by micro-nano processing technology. In an embodiment, the diameter of the wafer pressure welding pads 34 was 0.3 mm, and a plurality of wafer bonding pads 35 were machined on the other side. In an embodiment, the size, position and number of the wafer bonding pads 35 were aligned with the chiplet pressure welding pads 36 to be bonded; a plurality of TSV holes 311 were machined. In an embodiment, the diameter of the TSV holes 311 was 10 μm, and the TSV holes 311 were electrically connected with the wafer pressure welding pads 34 and the wafer bonding pads 35, and the wafer 31 was thinned to about 120 μm. Several chiplets 32 were bonded on the wafer 31 by thermo-compressed bonding process. During bonding, the wafer bonding pads 35 of the wafer were aligned with the chiplet bonding pads 36. After bonding, the chiplets 32 were filled with an organic filler 33, and then polished and thinned to a thickness of 220-240 μm by a Chemical Mechanical Polishing (CMP) process, so as to manufacture the system on wafer 3.

Figure 8:
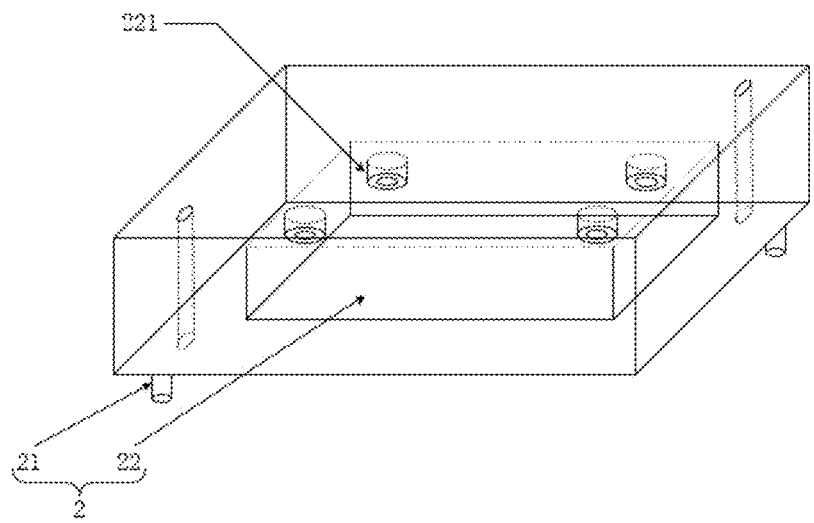
FIG. 8 is an oblique isometric view of the top structural part of the embodiment of the present disclosure.

In S3, referring to FIG. 8, a top structural part 2 with a size of 400 mm×400 mm×20 mm was prepared with red copper, and a top groove 22 with a size of 340 mm×340 mm×10 mm was prepared on the lower surface of the top structural part 2; a boss 221 with a height of 7 mm and a diameter of 5 mm was provided in the top groove 22, and the center of the boss 221 was provided with a M2.5×10 threaded hole. The center position and number of the bosses 221 corresponded to the position and number of M2.5 through holes of the PCB preformed die 5 in step S1. Two φ1.5×1.5 mm positioning pins 21 were also provided at the bottom of the top structural part 2; the whole top structural part 2 was also provided with a plurality of φ3.5 through holes, and the positions and numbers of the through holes were matched with the M3.5× 10 mm threaded holes provided in step 7 to make the top structural part 2.

Figure 9:
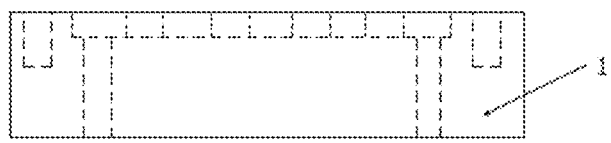
FIG. 9 is a top view and a side view of the lower part of the bottom structural part according to an embodiment of the present disclosure.
Figure 9:
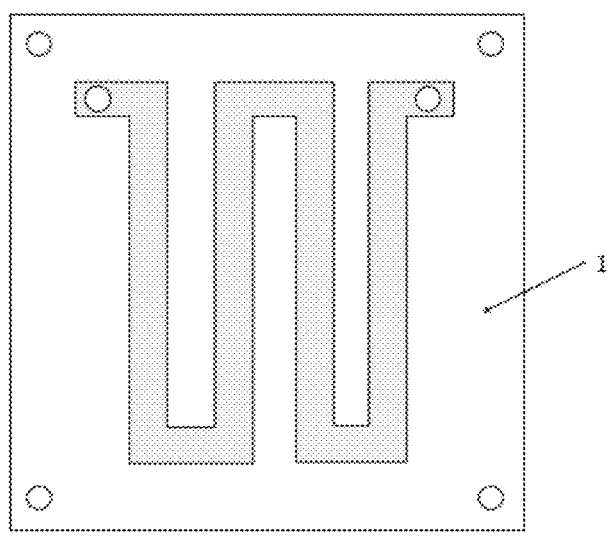
Figure 10:
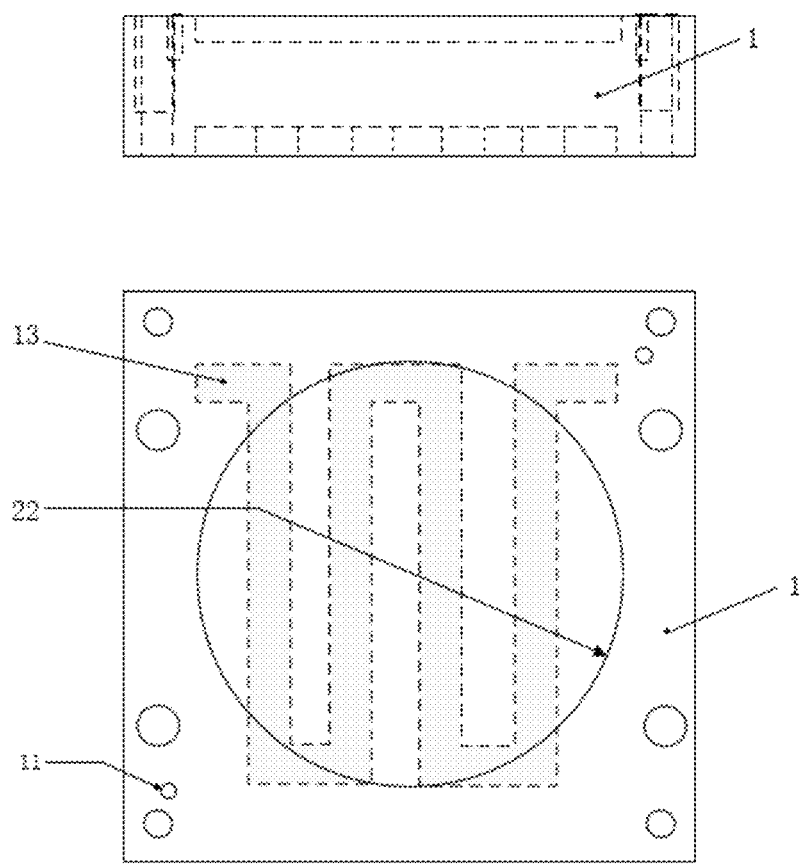
FIG. 10 is a top view and a side view of the upper part of the bottom structural part according to an embodiment of the present disclosure.
Figure 11:
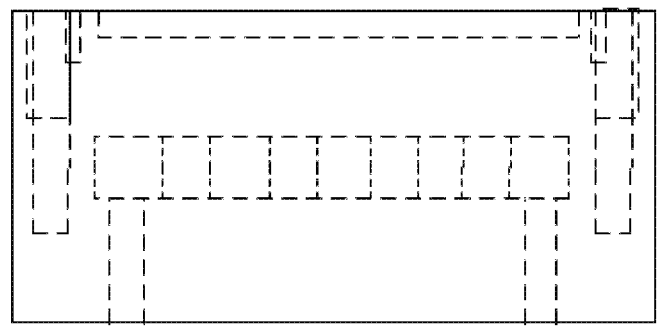
FIG. 11 is a top view and a side view of the bottom structural part according to an embodiment of the present disclosure.
Figure 11:
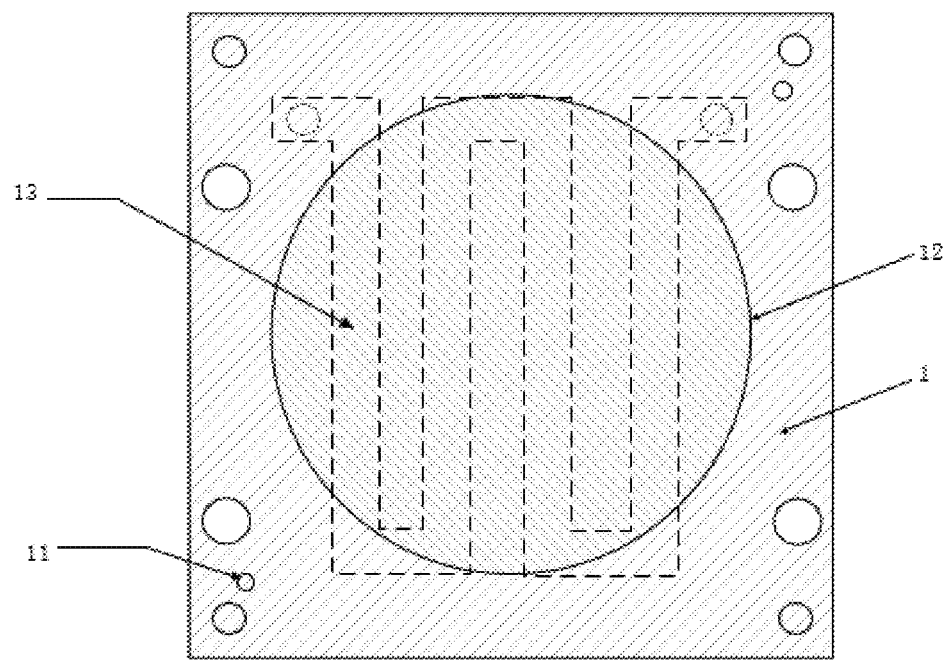

In S4, referring to FIG. 9, the lower part of the bottom structural part 1 was prepared with red copper, with a size of 400 mm×400 mm×15 mm, and several of M3×9 mm threaded holes were provided around the upper surface of the bottom structural part 1, and the middle area of the upper surface of the bottom structural part 1 was provided with a groove with a width of 3 mm; the wall thickness of the adjacent groove was 5 mm, and the groove depth was 1.5 mm. One φ2.5 mm through hole was provided at the beginning and end of the groove routing. As shown in FIG. 10, the upper part of the bottom structural part 1 was prepared with red copper, with a size of 400 mm×400 mm×15 mm, and several φ3 through holes were provided around it, with the position, quantity and size matching with the upper part. A φ304.8 mm bottom groove 12 with a depth of 0.4 mm was provided on the upper surface of the bottom structural part 1; the lower surface of the bottom structure 1 was provided with a groove with a depth of 1.5 mm, with the width, direction and wall thickness matching the upper surface of the bottom structure 1; two φ1.5×2 mm positioning holes 11 and several M3.5×10 mm threaded holes were also provided in the diagonally opposite corners of the upper surface of the bottom structural member 1; referring to FIG. 11, the upper and lower surfaces of the bottom structural part 1 were bonded together, and the grooves of the lower part of the bottom structural part 1 and the upper part of the bottom structural part 1 were bonded together to form a closed liquid cooling channel 13. A number of M3×20 mm screws passed through the φ3 through hole of the lower part of the bottom structural part 1 and went straight into the threaded hole of the upper part of the bottom structural part 1 to form the bottom structural part 1.

In S5, the PCB preformed die 5 was mounted and fixed on the boss 221 in the top groove 22 of the top structural part 2 by using a plurality of M2.5×8 mm countersunk screws, making the φ0.3 blind hole 512 face outward from the top groove 22, exposing the bonding pad 52; several wool buttons with a diameter of 0.254 mm and a length of 1.78 mm, which were consistent with the blind holes 512, passed through the blind holes 512 with a diameter of 0.3 and contacted with the bonding pads 52 to prepare a top preformed die.

In S6, thermal conductive silicone grease of about 250 um thick was coated in the bottom groove 12 of the bottom structural part 1, and the system on wafer 3 was placed into the bottom groove 12, with the CMP-treated side facing downwards, to prepare a bottom preformed die.

In S7, the bottom preformed die and the top preformed die were positioned and aligned through the positioning pin 21, and stuck together, and fixed with a plurality of M3.5×36 mm screws to form an assembly.

In S8, a joint 7 with a matched size was installed in the φ2.5 mm hole at the bottom of the assembly, and it was ensured that the sealing between the joint 7 and the assembly was good, so that the assembly was completed.

See Table 1 for more detailed comparison of effects before and after implementation. Table 1 compares and analyzes the warpage of PCB 51, the warpage of the system on wafer 3, the height difference between PCB 51 and system on wafer 3, the working temperature of the system on wafer 3 before and after using liquid cooling heat dissipation, etc. As the PCB 51 is fixed with boss 221 in top groove 22 of the top structural part 2, the warpage of the PCB 51 is reduced from 0.35% to 0.05%. On the other hand, due to the use of the organic filler 33 and the CMP process, the system on wafer 3 has good flatness, only 0.03% warpage and 0.092 mm height difference. It can also be seen from Table 1 that the working temperature of the system on wafer 3 has dropped by 30° C. after using the liquid cooling heat dissipation technology.

Comparative example: Refer to Table 2, the large CTE difference between a metal layer and a laminate leads to PCB warpage. See Table 3, at present, the overall warpage of the PCB processed by first-line PCB manufacturers at home and abroad according to factors such as laminated plates, traces, vias, copper thickness, etc. is 0.25%-1%, and the warpage of large-size and complex structures is >0.5%.

TABLE 2

| | Common Plate Parameters | | | | |
| --- | --- | --- | --- | --- | --- |
| Supplier | Plate material | DK (1 GHz) | DF (1 GHz) | Tg (° C.) | Z-CTE (50-260° C.) |
| ISOLA | FR408 | 3.77 | 0.011 | one hundred and eighty | 2.5% |
| | FR408HR | 3.68 | 0.009 | 200 | 3.8% |
| Panasonic | M4 (R5725) | 3.8 | 0.005 | 175 | 2.8% |
| | M6 (R5775K) | 3.6 | 0.002 | 185 | 0.95% |
| ARLON | TC350 | 3.5 | 0.02 | 200 | 1.2% |
| ROGERS | RO4350B | 3.48 | 0.0031 | 280 | 0.63% |
| NECLO | N4103-13 | 3.7 | 0.009 | 210 | 3.4% |
| SYST | S7240 | 3.9 | 0.005 | 200 | 2% |
| SYTECH | Mmwave77 | 3.0 | 0.001 | 538 | 0.46% |
| | LNB33 | 3.3 | 0.0025 | 280 | 1.16% |

TABLE 1

| Comparison before and after this embodiment | | |
| --- | --- | --- |
| Item | Before implementation | After implementation |
| PCB 51 | Warpage: 0.35%; Size: 340 mm × 340 mm × 1.0 mm; Structure: 6 M4 daughter boards and 2 copper-free daughter boards; | The warpage of the PCB 51 fixed on the boss 221 in the top groove 22 of the top structural part 2: 0.05% |
| Top structural part 2 | Warpage: <0.01%; Groove size: 340 mm × 400 mm × 10 mm; | |
| Upper crystal system 3 | Warpage: 0.03%; Size: 12 inches, diameter 304.8 mm; ; Thickness: 0.22 mm; | warpage: 0.03%; Thickness: 0.22 mm system on wafer 3 + 0.25 mm thermal conductive silicone grease; |
| Working temperature | The thermal power density is 5 W/cm², the heat dissipation is achieved by air cooling, and the operating temperature of the system on wafer 3 is about 120° C. (the ambient temperature is 25° C.). | The thermal density is 5 W/cm², heat dissipation is achieved by liquid cooling, and the operating temperature of the system on wafer 3 is about 90° C. (the ambient temperature is 25° C.). |
| electrical connection | The expansion and contraction length of the wool button with a diameter of 10 mil and a length of 70 mil is 1.778-2.133 mm. Because the PCB 51 warps too much, the height difference is 1.19 mm, and the effective compression of the wool button is only 0.355 mm, so it cannot form a reliable connection with the system on wafer 3. | Height difference of PCB 51 is reduced to 340 mm × 0.05% = 0.17 mm; The height difference of upper crystal system 3 is 304.8 mm × 0.03% = 0.0915 mm; The maximum height difference between PCB 51 and system on wafer 3 is: 0.0915 mm + 0.17 mm = 0.2615 mm, less than 0.355 mm, which can form a stable connection within the elastic compression range of the wool buttons. |

TABLE 3

Thermal expansion coefficient of common materials

| Material | CTE (60-250° C.) | Material | CTE (60-250° C.) |
|---|---|---|---|
| copper | 0.37% | molybdenum | 0.11% |
| aluminium | 0.48% | titanium | 0.23% |
| lead | 0.62% | wolfram | 0.09% |
| gold | 0.29% | zinc | 0.76% |
| silver | 0.41% | iron | 0.26% |
| tin | 0.04% | PVC | 1.68% |
| platinum | 0.19% | PMMA | 1.78% |

According to the data provided in Table 2 and Table 3, the warpage of the PCB can be moderately improved by selecting the board with CTE similar to that of metal. However, there is a big gap between PCBs and wafers in flatness or warpage. Wafers can be polished and ground to ensure flatness, but PCBs cannot be improved by similar processes. Therefore, the interconnection between a PCB and a wafer cannot be solved by referring to the thermo-compressed bonding or solder welding process used for the interconnection between chiplet and wafer, which has become the key technical problem of SOW technology integration.

To sum up, the embodiment of the present disclosure provides an interconnection structure of a system on wafer and a PCB based on a TSV process and its manufacturing method, which can not only solve the problem of communication between large-size system on wafer and warped PCB, but also solve the problem of heat dissipation of the system on wafer, thus providing technical support for power supply, debugging and signal input and output of system on wafer, and providing technical guarantee for the design and manufacturing of system on wafer with higher speed and larger capacity.

The above is only the preferred embodiment of the present disclosure, and it is not intended to limit the present disclosure. For those skilled in the art, the present disclosure can be modified and varied. Any modification, equivalent substitution, improvement, etc. made within the spirit and principle of the present disclosure shall be included in the scope of protection of the present disclosure.

What is claimed is:

1. An interconnection structure of a system on wafer and a PCB based on a TSV process, comprising
    a bottom structural part provided with a bottom groove at an upper surface thereof, wherein a lower surface of a system on wafer is fittedly connected with the bottom groove;
    a top structural part provided with a top groove at a lower surface thereof and detachably linked with the bottom structural part by a connector, wherein one end of a PCB preformed die is connected within the top groove by a connector, and the other end of the PCB preformed die (5) is connected with the system on wafer by an elastic connector; and
    the system on wafer provided in the bottom groove, comprising:
        a wafer provided in the bottom groove with a plurality of groups of through TSV holes,
        chiplets,
        an organic filler filled between adjacent chiplets,
        wafer pressure welding pads provided at an upper surface of the wafer corresponding to the TSV holes,
        wafer bonding pads provided at a lower surface of the wafer corresponding to the TSV holes, and
        chiplet bonding pads connected with a lower surface of the wafer bonding pad at one end and connected with the chiplet at the other end thereof.

2. The interconnection structure of the system on wafer and the PCB based on a TSV process according to claim 1, wherein the lower surface of the wafer bonding pad is bonded to the chiplet bonding pad by a thermo-compressed bonding process or a pollution-free welding process.

3. The interconnection structure of the system on wafer and the PCB based on a TSV process according to claim 1, wherein each group of TSV holes consists of four TSV holes, and the TSV holes and the wafer bonding pads are arranged in a staggered manner.

4. The interconnection structure of the system on wafer and the PCB based on a TSV process according to claim 1, wherein the PCB preformed die comprises a PCB and a bonding pad, an upper surface of the top groove is provided with a plurality of bosses, the PCB is provided with through holes corresponding to the bosses, the PCB penetrates through the through holes by a connector and extends to the bosses to be connected with the top groove, a plurality of blind holes corresponding to the wafer pressure welding pads are uniformly arranged on a lower surface of the PCB, the bonding pad is provided at a top wall of the blind hole, and the elastic connector is connected with a lower surface of the bonding pad at one end, and connected with the wafer pressure welding pad at the other end thereof.

5. The interconnection structure of a system on wafer and a PCB based on a TSV process according to claim 1, wherein a liquid cooling channel is provided inside the bottom structural part.

6. The interconnection structure of the system on wafer and the PCB based on a TSV process according to claim 5, wherein both ends of the liquid cooling channel are provided with connectors.

7. The interconnection structure of the system on wafer and the PCB based on a TSV process according to claim 1, wherein the bottom structural part and the top structural part are made of metal or ceramic, the upper surface of the bottom structural part is provided with a plurality of positioning holes, and the lower surface of the top structural part is provided with positioning pins that are matched with the positioning holes.

8. The interconnection structure of the system on wafer and the PCB based on a TSV process according to claim 1, wherein the elastic connector is a micro-spring, a wool button or an elastic insulator.

9. A method for manufacturing an interconnection structure of a system on wafer and a PCB based on a TSV process according to claim 1, comprising:
    S1, machining a plurality of through holes on a PCB, machining a plurality of blind holes on a lower surface of the PCB, and welding bonding pads in the plurality of blind holes to form a PCB preformed die;
    S2, preparing a plurality of through TSV holes on a wafer by a micro-nano process, wherein wafer pressure welding pads are provided at an upper surface of the wafer corresponding to the TSV holes, and wafer bonding pads are provided at a lower surface of the wafer corresponding to the TSV holes; buckling a plurality of chiplets on the wafer upside down, so that chiplet bonding pads are aligned with the wafer bonding pads, and are bonded together with the wafer bonding pads by a hot-press bonding process or a pollution-free welding process, then filling gaps with an organic filler, and then polishing and thinning by a CMP process to form a system on wafer;

S3, machining a top structural part, preparing a top groove at a lower surface of the top structural part, preparing a boss in the top groove, and providing a positioning pin at the lower surface of the top structural part;

S4, machining a bottom structural part, preparing a bottom groove at an upper surface of the bottom structural part, further preparing a positioning hole matched with the top structural part in the bottom structural part, and preparing a closed liquid cooling channel inside the bottom structural part;

S5, placing the PCB preformed die in the top groove of the top structural part, and fixedly connecting the PCB preformed die with the top groove by a connector penetrating through the through hole of the PCB and extending to the boss, so as to form a top preformed die;

S6, placing the system on wafer in the bottom groove of the bottom structural part with the chiplets facing downwards, and fittedly fixing the system on wafer with the bottom groove to form a bottom preformed die;

S7, inserting an elastic connector into a blind hole of the PCB and connecting the elastic connector with the bonding pad, matching the positioning pin of the top structural part with the positioning hole of the bottom structural part, so that the other end of the elastic connector is connected with the wafer pressure welding pads at the system on wafer, and penetrating through the top structural part by a plurality of connectors and extending to the bottom structural part to form an interconnected structure; and S8, installing a joint at a port of the liquid cooling channel of the bottom structural part, and sealing with a glue to ensure no water leakage, thus completing assembly.

\* \* \* \* \*